(12) United States Patent
Chiang et al.

(10) Patent No.: US 12,107,549 B2
(45) Date of Patent: Oct. 1, 2024

(54) AMPLIFIER WITH ENHANCED SLEW RATE

(71) Applicant: Himax Technologies Limited, Tainan (TW)

(72) Inventors: Yi-Lun Chiang, Tainan (TW); Jia-Hui Wang, Tainan (TW)

(73) Assignee: Himax Technologies Limited, Tainan (TW)

( * ) Notice: Subject to any disclaimer, the term of this patent is extended or adjusted under 35 U.S.C. 154(b) by 316 days.

(21) Appl. No.: 17/693,814

(22) Filed: Mar. 14, 2022

(65) Prior Publication Data

US 2023/0318530 A1 Oct. 5, 2023

(51) Int. Cl.
H03F 3/45 (2006.01)
H03F 1/02 (2006.01)
H03F 3/04 (2006.01)
H03F 3/30 (2006.01)

(52) U.S. Cl.
CPC ............ *H03F 1/0205* (2013.01); *H03F 3/04* (2013.01); *H03F 3/3022* (2013.01); *H03F 3/45183* (2013.01)

(58) Field of Classification Search
CPC .......... H03F 1/0205; H03F 3/04; H03F 3/303; H03F 2203/45248; H03F 3/45246; H03F 3/45219; H03F 3/3022; H03F 3/45183; H03F 3/45192; H03F 3/45179; H03F 3/45089
USPC .................................................. 330/253, 255
See application file for complete search history.

(56) References Cited

U.S. PATENT DOCUMENTS

| | | | | |
|---|---|---|---|---|
| 6,392,485 | B1 * | 5/2002 | Doi ..................... | H03F 3/45219 330/253 |
| 6,987,420 | B2 * | 1/2006 | Miura ..................... | H03F 3/303 330/253 |
| 7,102,436 | B2 * | 9/2006 | Sung ................... | H03F 3/45192 330/255 |
| 7,679,432 | B2 * | 3/2010 | Huang ............... | H03F 3/45475 330/253 |
| 8,044,950 | B2 * | 10/2011 | Satou ................... | G09G 3/3688 345/212 |
| 8,217,721 | B1 * | 7/2012 | Hsieh .................. | H03F 3/45219 330/257 |
| 8,222,957 | B2 * | 7/2012 | Kato ..................... | H03F 3/4521 330/253 |
| 9,628,034 | B2 * | 4/2017 | Jeong .................... | H03F 3/303 |
| 9,692,374 | B2 * | 6/2017 | Saeki .................. | H03F 3/45475 |

* cited by examiner

*Primary Examiner* — Khanh V Nguyen
(74) *Attorney, Agent, or Firm* — Stout, Uxa & Buyan, LLP; Donald E. Stout

(57) ABSTRACT

An amplifier with enhanced slew rate includes an input stage including a first channel coupled to receive differential inputs and a second channel coupled to receive the differential inputs; a middle stage including a first current source coupled to receive outputs of the second channel and electrically connected to power, a second current source coupled to receive outputs of the first channel and electrically connected to ground, and a floating current source electrically connected between the first current source and the second current source; and an output stage coupled to the middle stage to generate an output voltage. A transit circuit is disposed in the input stage or the middle stage, controlled by the output stage, and configured to supply extra current during signal transition of the differential inputs, thereby enhancing the slew rate.

11 Claims, 2 Drawing Sheets

AMPLIFIER WITH ENHANCED SLEW RATE

BACKGROUND OF THE INVENTION

1. Field of the Invention

The present invention generally relates to an amplifier, and more particularly to an amplifier with high slew rate.

2. Description of Related Art

A liquid-crystal display (LCD) is a type of flat-panel display that presents visual information by modulating liquid crystals (LC) in an LC panel. The LC panel of the LCD is commonly driven by drivers such as a gate driver (or scan driver) and a source driver (or data driver), which are coordinated by a timing controller.

A rail-to-rail class-AB amplifier is usually adapted to the drivers of the LCD. High slew rate is one of key parameters for guaranteeing the performance of the drivers of the LCD, particularly a large-size or high-resolution LCD. The slew rate is defined as the change of voltage (or current) per unit of time, for example, expressed in volts/second (or amperes/second).

The slew rate may be enhanced, for example, by increasing current in the circuit, which however may increase power consumption and even affect stability of the circuit.

A need has thus arisen to propose a novel scheme capable of improving slew rate of a buffer amplifier adaptable to the LCD.

SUMMARY OF THE INVENTION

In view of the foregoing, it is an object of the embodiment of the present invention to provide an amplifier with enhanced slew rate without increasing quiescent current.

According to one embodiment, an amplifier with enhanced slew rate, includes an input stage, a middle stage and an output stage. The input stage includes a first channel coupled to receive differential inputs and a second channel coupled to receive the differential inputs. The middle stage includes a first current source coupled to receive outputs of the second channel and electrically connected to power, a second current source coupled to receive outputs of the first channel and electrically connected to ground, and a floating current source electrically connected between the first current source and the second current source. The output stage is coupled to the middle stage to generate an output voltage. A transit circuit is disposed in the input stage or the middle stage, controlled by the output stage, and configured to supply extra current during signal transition of the differential inputs, thereby enhancing the slew rate.

DETAILED DESCRIPTION OF THE INVENTION

Figure 1:
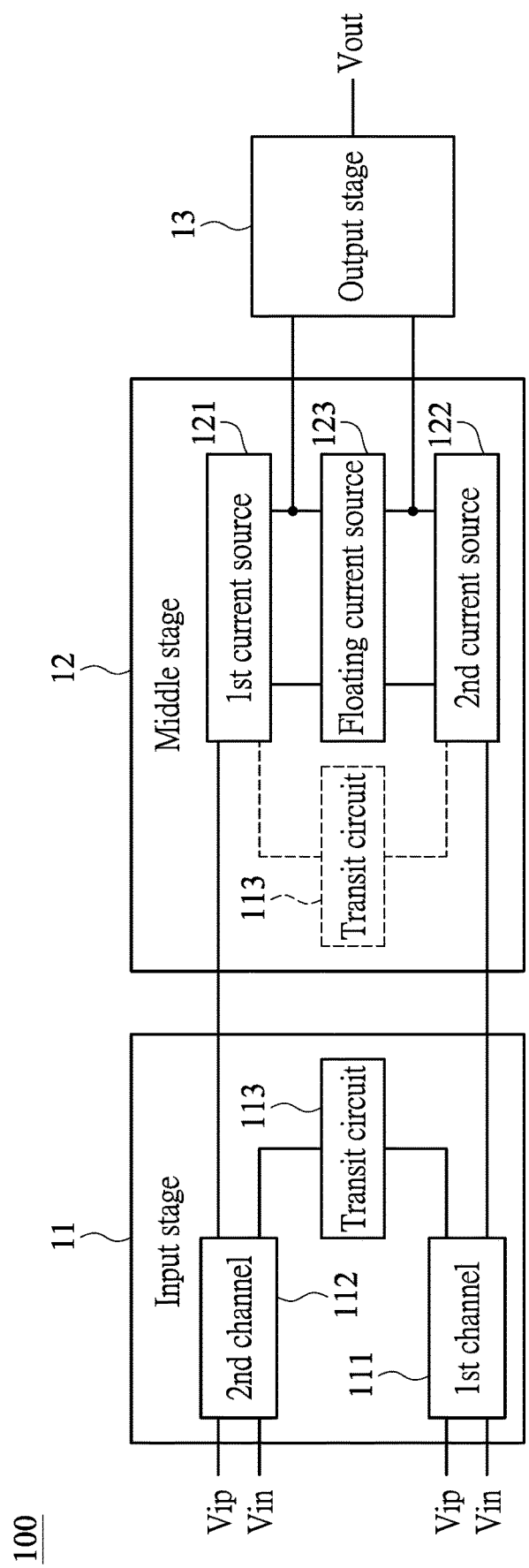
FIG. 1 shows a block diagram illustrating an amplifier with enhanced slew rate according to one embodiment of the present invention.
Figure 2:
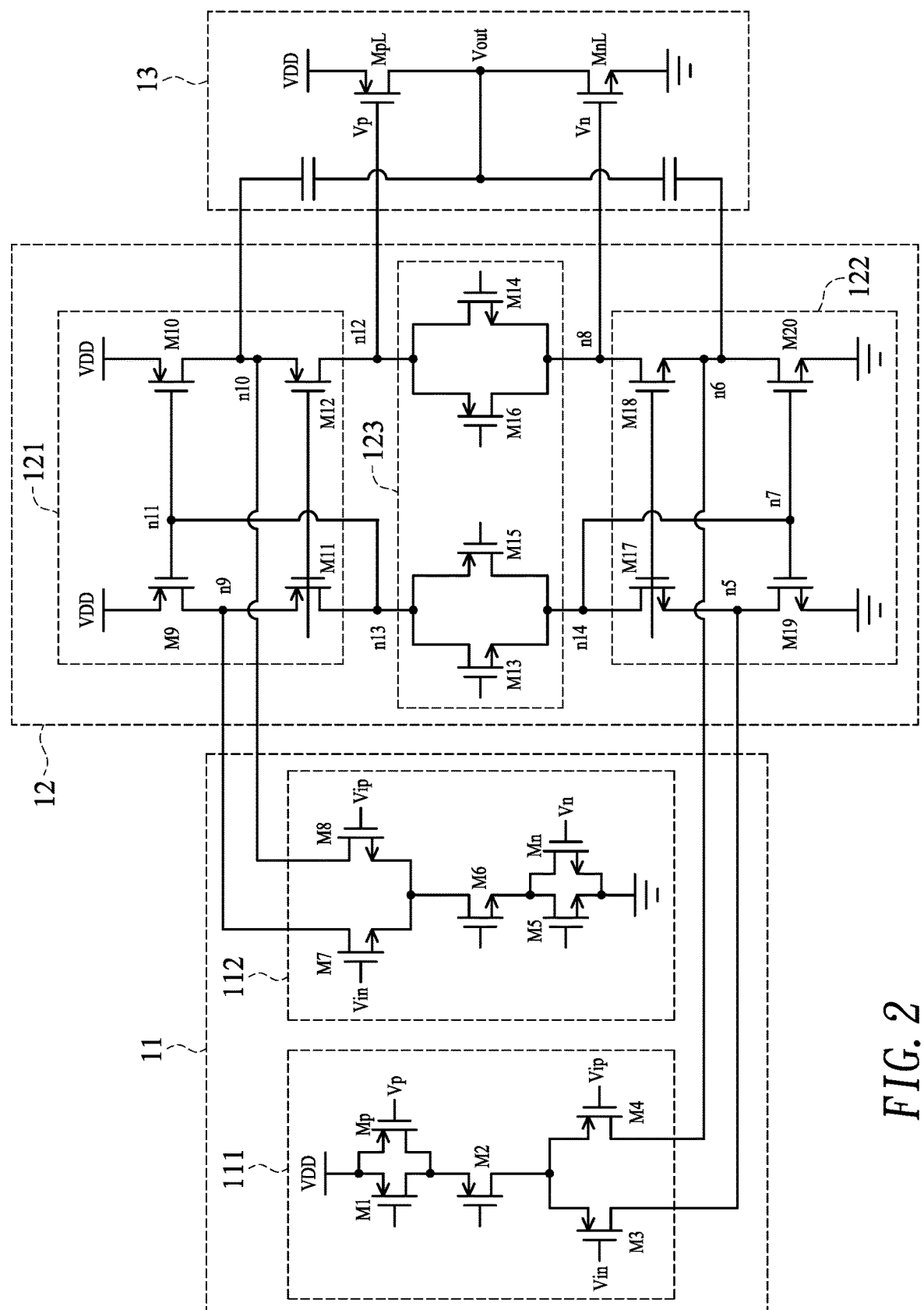
FIG. 2 shows a circuit diagram illustrating the amplifier with enhanced slew rate according to the embodiment of the present invention.

FIG. 1 shows a block diagram illustrating an amplifier with enhanced slew rate 100 according to one embodiment of the present invention and FIG. 2 shows a circuit diagram illustrating the amplifier with enhanced slew rate 100 according to the embodiment of the present invention.

In the embodiment, the amplifier with enhanced slew rate ("amplifier" hereinafter) 100 may include an input stage 11, a middle stage 12 and an output stage 13.

The input stage 11 of the embodiment may include a first channel 111 coupled to receive differential inputs Vip and Vin, and composed of first-type transistors (e.g., P-type metal-oxide-semiconductor (PMOS) transistors) M1-M4. Specifically, the transistors M1-M2 are connected in series (with the transistor M1 coupled to power VDD) to form a first bias branch, and the transistors M3-M4 are connected in parallel with sources connected together to form a first source-coupled differential pair, which is connected to (the transistor M2 of) the first bias branch.

The input stage 11 of the embodiment may include a second channel 112 coupled to receive the differential inputs Vip and Vin, and composed of second-type transistors (e.g., N-type MOS transistors or NMOS transistors) M5-M8. Specifically, the transistors M5-M6 are connected in series (with the transistor M5 coupled to ground) to form a second bias branch, and the transistors M7-M8 are connected in parallel with sources connected together to form a second source-coupled differential pair, which is connected to (the transistor M6 of) the second bias branch.

According to one aspect of the embodiment, the input stage 11 may include a transit circuit 113 electrically connected to the first channel 111 and the second channel 112, controlled by the output stage 13, and configured to supply extra current during signal transition of the differential inputs Vip and Vin, thereby enhancing the slew rate. Specifically, the transit circuit 113 may include a (first-type) first transit transistor Mp connected in parallel with one transistor, for example, the transistor M1 of the first bias branch M1/M2. Specifically, source and drain of the first transit transistor Mp are connected to corresponding source and drain of the transistor M1. In an alternative embodiment, the first transit transistor Mp may be connected in parallel with both the transistors M1-M2 by connecting sources of the first transit transistor Mp and the transistor M1 and connecting drains of the first transit transistor Mp and the transistor M2.

The transit circuit 113 may include a (second-type) second transit transistor Mn connected in parallel with one transistor, for example, the transistor M5 of the second bias branch M5/M6. Specifically, source and drain of the second transit transistor Mn are connected to corresponding source and drain of the transistor M5. In an alternative embodiment, the second transit transistor Mn may be connected in parallel with both the transistors M5-M6 by connecting sources of the second transit transistor Mn and the transistor M5 and connecting drains of the second transit transistor Mn and the transistor M6.

The middle stage 12 of the embodiment may include a first current source 121 coupled to receive outputs of the second channel 112, and electrically connected to the power VDD. The first current source 121 may include first-type transistors M9-M12. Specifically, the transistors M9 and M11 are connected in series (with the transistor M9 coupled to the power VDD), at a first intermediate node n9, to form a first current branch, and the transistors M10 and M12 are connected in series (with the transistor M10 coupled to the power VDD), at a second intermediate node n10, to form a second current branch. Gates of corresponding transistors of the first and the second current branches are coupled together. For example, gates of the transistors M9-M10 adjacent to the power VDD are coupled at a first coupling node n11, which is further connected to a drain of the transistor M11. It is noted that the first intermediate node n9 and the second intermediate node n10 are connected to drains of the second source-coupled differential pair M7-M8, respectively.

The middle stage 12 of the embodiment may include a second current source 122 coupled to receive outputs of the first channel 111, and electrically connected to the ground. The second current source 122 may include second-type transistors M17-M20. Specifically, the transistors M17 and M19 are connected in series (with the transistor M19 coupled to the ground), at a third intermediate node n5, to form a third current branch, and the transistors M18 and M20 are connected in series (with the transistor M20 coupled to the ground), at a fourth intermediate node n6, to form a fourth current branch. Gates of corresponding transistors of the third and the fourth current branches are coupled together. For example, gates of the transistors M19-M20 adjacent to ground are coupled at a second coupling node n7, which is further connected to a drain of the transistor M17. It is noted that the third intermediate node n5 and the fourth intermediate node n6 are connected to drains of the first source-coupled differential pair M3-M4, respectively.

The middle stage 12 of the embodiment may include a floating current source 123 (composed of first-type transistors M13-M14 and second-type transistors M15-M16) electrically connected between the first current source 121 and the second current source 122. Specifically, the transistors M13 and M15 are connected in parallel to form a first floating branch, which is connected between the first current branch (at a first connected node n13) of the first current source 121 and the third current branch (at a second connected node n14) of the second current source 122. The transistors M14 and M16 are connected in parallel to form a second floating branch, which is connected between the second current branch (at a third connect node n12) of the first current source 121 and the fourth current branch (at a fourth connect node n8) of the second current source 122.

It is noted that the third connect node n12 and the fourth connect node n8 are used as a first output node and a second output node of the middle stage 12.

The output stage 13 of the embodiment is coupled to the first output node and the second output node of the middle stage 12, and configured to generate an output voltage at the output node Vout (of the output stage 13). The output stage 13 may include an output branch composed of a (first-type) first output transistor MpL and a (second-type) second output transistor MnL connected in series between the power VDD and the ground. Gates of the first output transistor MpL and the second output transistor MnL are coupled to the first output node (i.e., n12) and the second output node (i.e., n8) of the middle stage 12, respectively. Further, a voltage Vp at the gate of the first output transistor MpL is coupled to a gate of the first transit transistor Mp, and a voltage Vn at the gate of the second output transistor MnL is coupled to a gate of the second transit transistor Mn.

In operation, during signal transition of a differential input voltage between Vip and Vin from high level to low level, the second transit transistor Mn turns on, thereby supplying extra current and thus enhancing the slew rate. On the other hand, during signal transition of the differential input voltage between Vip and Vin from low level to high level, the first transit transistor Mp turns on, thereby supplying extra current and thus enhancing the slew rate.

In an alternative embodiment, the transit circuit 113 may be electrically connected to the first current source 121 and the second current source 122. Specifically, the first transit transistor Mp may be connected in parallel with one transistor, for example, the transistor M9 of the first current branch M9/M11. Specifically, source and drain of the first transit transistor Mp are connected to corresponding source and drain of the transistor M9. Alternatively, the first transit transistor Mp may be connected in parallel with one transistor, for example, the transistor M10 of the second current branch M10/M12. Specifically, source and drain of the first transit transistor Mp are connected to corresponding source and drain of the transistor M10.

The second transit transistor Mn may be connected in parallel with one transistor, for example, the transistor M19 of the third current branch M17/M19. Specifically, source and drain of the second transit transistor Mn are connected to corresponding source and drain of the transistor M19. Alternatively, the second transit transistor Mn may be connected in parallel with one transistor, for example, the transistor M20 of the fourth current branch M18/M20. Specifically, source and drain of the second transit transistor Mn are connected to corresponding source and drain of the transistor M20.

Although specific embodiments have been illustrated and described, it will be appreciated by those skilled in the art that various modifications may be made without departing from the scope of the present invention, which is intended to be limited solely by the appended claims.

What is claimed is:

1. An amplifier with enhanced slew rate, comprising:
   an input stage including a first channel coupled to receive differential inputs and a second channel coupled to receive the differential inputs;
   a middle stage including a first current source coupled to receive outputs of the second channel and electrically connected to power, a second current source coupled to receive outputs of the first channel and electrically connected to ground, and a floating current source electrically connected between the first current source and the second current source; and
   an output stage coupled to the middle stage to generate an output voltage;
   wherein a transit circuit is disposed in the input stage or the middle stage, controlled by voltages at output nodes of the middle stage, and configured to supply extra current during signal transition of the differential inputs, thereby enhancing the slew rate;
   wherein the first channel comprises a first bias branch electrically connected to the power, the first bias branch including transistors connected in series.

2. The amplifier of claim 1, wherein the first channel comprises:
   a first source-coupled differential pair including transistors connected in parallel with sources connected together to the first bias branch.

3. The amplifier of claim 2, wherein the second channel comprises:
   a second bias branch electrically connected to the ground, the second bias branch including transistors connected in series; and
   a second source-coupled differential pair including transistors connected in parallel with sources connected together to the second bias branch.

4. The amplifier of claim 3, wherein the output stage comprises:

an output branch composed of a first output transistor and a second output transistor connected in series between the power and the ground, gates of the first output transistor and the second output transistor are coupled to the output nodes of the middle stage.

5. The amplifier of claim 4, wherein the transit circuit comprises:
   a first transit transistor connected in parallel with one transistor of the first bias branch; and
   a second transit transistor connected in parallel with one transistor of the second bias branch;
   wherein a voltage at a gate of the first output transistor is coupled to a gate of the first transit transistor, and a voltage at a gate of the second output transistor is coupled to a gate of the second transit transistor.

6. The amplifier of claim 5, wherein the first transit transistor, the first output transistor and the first channel include first-type transistors, and the second transit transistor, the second output transistor and the second channel include second-type transistors, the second-type being opposite to the first-type.

7. The amplifier of claim 1, wherein the first current source comprises:
   a first current branch electrically connected between the power and a first connect node, the first current branch including transistors connected at a first intermediate node; and
   a second current branch electrically connected between the power and a third connect node, the second current branch including transistors connected at a second intermediate node.

8. The amplifier of claim 7, wherein the second current source comprises:
   a third current branch electrically connected between the ground and a second connect node, the third current branch including transistors connected at a third intermediate node; and
   a fourth current branch electrically connected between the ground and a fourth connect node, the fourth current branch including transistors connected at a fourth intermediate node.

9. The amplifier of claim 8, wherein the output stage comprises:
   an output branch composed of a first output transistor and a second output transistor connected in series between the power and the ground, gates of the first output transistor and the second output transistor are coupled to the output nodes of the middle stage.

10. The amplifier of claim 9, wherein the transit circuit comprises:
    a first transit transistor connected in parallel with one transistor of the first current branch or the second current branch; and
    a second transit transistor connected in parallel with one transistor of the third current branch or the fourth current branch;
    wherein a voltage at a gate of the first output transistor is coupled to a gate of the first transit transistor, and a voltage at a gate of the second output transistor is coupled to a gate of the second transit transistor.

11. The amplifier of claim 10, wherein the first transit transistor, the first output transistor, the first current branch and the second current branch include first-type transistors, and the second transit transistor, the second output transistor, the third current branch and the fourth current branch include second-type transistors, the second-type being opposite to the first-type.

* * * * *